United States Patent [19]

Brady

[11] Patent Number: 4,935,972
[45] Date of Patent: Jun. 26, 1990

[54] WATERPROOF VIBRATING CUSHION

[76] Inventor: Antonio Brady, 2528 C St. #5, San Diego, Calif. 92102

[21] Appl. No.: 38,997

[22] Filed: Apr. 16, 1987

Related U.S. Application Data

[63] Continuation-in-part of Ser. No. 887,533, Jul. 21, 1986, abandoned, which is a continuation-in-part of Ser. No. 887,730, Jul. 21, 1986, abandoned, which is a continuation-in-part of Ser. No. 788,834, Oct. 18, 1985, abandoned.

[51] Int. Cl.⁵ .............................................. A47K 3/022
[52] U.S. Cl. ............................................ 4/575; 128/33
[58] Field of Search ................ 4/575; 128/33; 5/436, 5/446, 473; 150/52 R, 52 E; 383/97

[56] References Cited

U.S. PATENT DOCUMENTS

| | | |
|---|---|---|
| 2,167,178 | 7/1939 | Kohlstadt .............................. 4/575 |
| 2,289,254 | 7/1942 | Eagles .................................. 383/97 |
| 2,728,926 | 2/1953 | Emery .................................... 5/338 |
| 3,981,032 | 9/1976 | Brooks ............................. 128/33 X |
| 4,136,685 | 1/1979 | Ramey ................................. 128/33 |
| 4,559,929 | 12/1985 | Hseu ..................................... 128/33 |
| 4,592,345 | 6/1986 | Wahl ..................................... 128/33 |

Primary Examiner—Charles E. Phillips
Attorney, Agent, or Firm—Ralph Branscomb

[57] ABSTRACT

An impermeable, vibrating pillow is provided with suction cups so that it may be conveniently bonded temporarily to the surface of a bathtub, jacuzzi or the like to support the neck, feet, or other regions of the body and provide a gentle, relaxing massage by virtue of the vibrator, which is embedded in the foam portion of the cushion and is actuated through the resilient cover by a pressure switch which is preferably mounted just inside one end of the cushion.

2 Claims, 1 Drawing Sheet

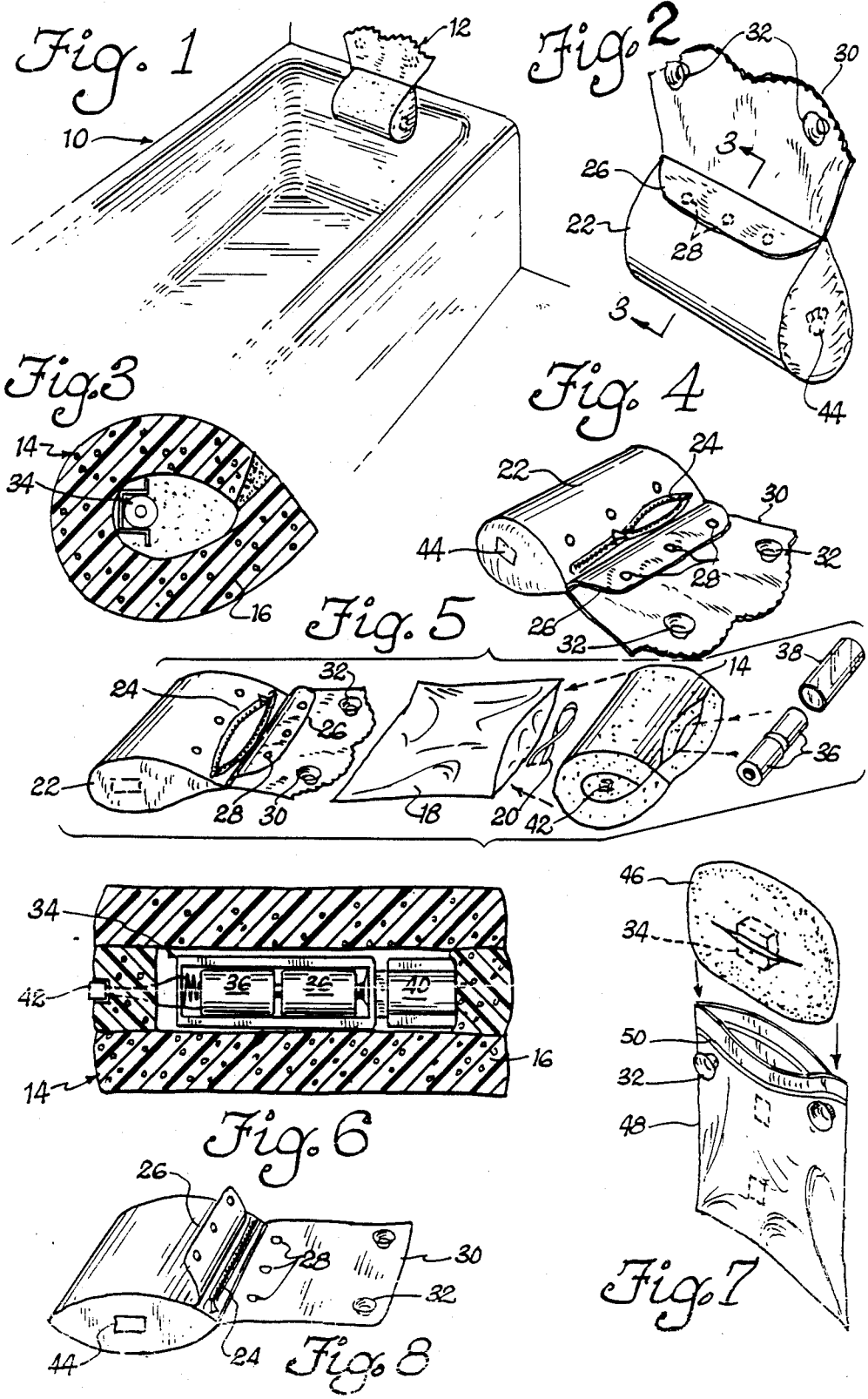

WATERPROOF VIBRATING CUSHION

This application is a continuation-in-part of application Ser. No. 06/887,533, filed Jul. 21, 1986, and Ser. No. 06/887,730 also filed Jul. 21, 1986, both of which were continuation-in-part applications of Ser. No. 06/788,834 filed Oct. 18, 1985, all now abandoned.

The invention is also the subject of the following disclosure statements with the following filing dates: Ser. Nos. 150,194, May 12, 1986; 151,298, Jun. 2, 1986; 153,423, Jul. 21, 1986; 153,606, Jul. 22, 1986; 153,954, Jul. 28, 1986; 154,254, Aug. 5, 1986; 154,438, Aug. 11, 1986; 155,697, Sep. 8, 1986; 158,457, Nov. 3, 1986.

The invention is in the field of vibratory, massaging devices, and specifically relates to a vibratory cushion which is waterproof and intended for use in areas in which water or moisture would otherwise be a problem, such as bathtubs, jacuzzis, and even swimming pools.

There are a variety of different hand-held massage devices that are currently being marketed, and vibratory beds and chairs also stand testimonial to the popularity and the effectiveness of vibratory action in relieving tension, relaxing the body, and otherwise just making the user feel good.

There are also vibratory cushions for use in a conventional bed environment, and various cushions that may be bonded with suction cups or the like in a bathtub for the comfort of the bather.

There is a need, however, for a vibratory cushion which is adapted to be totally and completely waterproof for use in an aqueous environment, which is conveniently turned off and on without requiring access inside the waterproof barrier of the cushion, and which has convenient means for temporarily attaching itself to a bathtub or the like.

SUMMARY OF THE INVENTION

The invention fulfills the above-stated need and comprises a cushion made of a foam core, with a battery-operated vibratory unit mounted inside the foam core, with the vibrator being actuated from externally of the cushion by means of a pressure switch which is disposed just inside the outer, waterproof cover of the cushion.

The resilient, foam core is preferably comprised of a single slab of foam which is folded either to define a substantially cylindrical pillow shape, or folded flat to define a generally planar pillow sheet, with a cylindrical vibrator unit inside the core.

The foam core is encased inside an impermeable plastic bag, and the bag is encased inside a special impermeable cover which has a zipper or equivalent linear closure, which is covered by a flap which snaps or fastens over the zipper closure.

The cushion is temporarily attached to a bathtub surface or the like by virtue of a sheet or flap which extends from the body of the cushion and mounts a pair of suction cups.

BRIEF DESCRIPTION OF THE DRAWINGS

FIG. 1 illustrates a cushion in use with a bathtub;

FIG. 2 is an isometric view of the cushion from the back illustrating the suction cups;

FIG. 3 is a section taken along line 3—3 of FIG. 2 (outer cover is omitted);

FIG. 4 is an isometric view of the cushion illustrating the action of the zipper and covered or interlocking flap;

FIG. 5 is an exploded perspective illustrating the components of the cushion;

FIG. 6 is a section illustrating the battery compartment of the vibrator unit; and FIG. 7 is a modification wherein the cushion comprises a flatfolded foam slab.

FIG. 8 is an isometric view of another modification of the cushion.

DETAILED DESCRIPTION OF THE PREFERRED EMBODIMENT

The invention is intended for use in a bathtub or other aqueous environment as indicated in FIG. 1, wherein a bathtub 10 is made more comfortable by the temporary affixing of the cushion unit 12 to the head, or foot, end of the bathtub.

The cushion comprises a central core 14, which in the preferred, first, embodiment, illustrated in FIGS. 1 through 6, comprises a relative thick slab of foam 16 which is wrapped to define a generally cylindrical, or tear-dropped shaped configuration. Any sutiable resilient foam can be used. However, the foam should be reasonably soft to the touch, and flexible, and should resist mold and mildew.

The core 14 is preferably contained in a first-impermeable bag 18, indicated in FIG. 5, tied with a kind of closure 20 enclosing the neck of bag so that the core 14 is protected from water. Once inside the bag 18, the bag with the core inside is then inserted inside an impermeable cover 22, so that the core has a double barrier of impermeability to make certain water does not penetrate through to the core and its contents.

The cover 22 preferably has a water-tight zipper or other linear seal 24. To help protect against splashes and the like when the cushion is not actually submerged, a first flap 26 is utilized which folds over the linear seal 24, and is affixed to the body of the cover with snaps 28 or the equivalent.

Additionally, there is a plastic sheet or flap 30 which preferably is bonded to the same seam which mounts to flap 26, which mounts a pair of suction cups 32 to enable the cushion to be attached to a suitable environment as shown in FIG. 1, previously discussed.

Inside the foam core 14 is a vibrating unit 34. The vibrating unit that is used in the preferred embodiment consists of a generally cylindrical, longitudinally extended commercial unit having a pair of D-cell batteries 36, a cylindrical casing 38, a vibrator element 40, and a buttom switch 42 which is held adjacent to one end of the cushion and externally indicated 44 so that the user can conveniently depress the end of the cushion to actuate and de-actuate the vibrator unit.

The unit is thus relatively economic and simple to manufacture and assemble. The cover 22, with its two flaps, zipper structure and snaps, is the only specially constructed part of any complexity, with the rest being assembled from stock foam slab material, vibrators, bags, and the like. In a modification illustrated in FIG. 7, a single-fold slab 46 is folded over the vibrator 34, and inserted in a single, special bag 48, which is much like a large sandwich bag, with a water-tight linear seal 50 to keep out water. This model is simpler than the first, preferred embodiment, but is also less elegant.

In yet another modification, FIG. 8 illustrates an embodiment which is similar in internal construction to the first embodiment, but is a flatter configuration. Also, the flap 26 is reversed, so that it is hinged to the body of the cushion cover, with snaps 28 that fasten to the large flap 30, rather than to the body of the cover.

Either of the models, however, would convenienty provide the user with an additional degree of comfort and relief of muscle tension previously unavailable. In addition to being able to climb into a warm tub to relax, the user may now add one or more vibrating cushion to relax the neck muscles, the feet, or other parts of the body, to provide a new dimension in vibratory warmth and relaxation.

I claim:

1. A combined hydromassage apparatus and conventional body massager having a waterproof support vibrating cushion comprising:
    a resilient, form retaining core;
    an openable, substantially water impermeable cover;
    a battery powered cushion vibrator imbedded in said core;
    an impermeable bag encasing said core, said bag and core being disposed inside said substantially water impermeable cover such that said cushion provides a double layer of impermeability to protect said core and vibrator;
    said cover mounting a suction cup suspension means which includes a flexible sheet of length and width dimension on the order of that of said core, said sheet being connected to said cover and mounting a pair of suction cups mounted on said sheet to enable said cushion to be easily suspended from a slick surface such as the head end wall portion of a bathtub;
    wherein said core comprises a cylindrical slab of resilient stock foam of uniform thickness wrapped around said vibrator, and said vibrator is substantially cylindrical and generally coaxially disposed within said core;
    wherein said core is slit, and said vibrator is imbedded within said slit such that the batteries operating said vibrator are easily accessible for replacement through said slit;
    and wherein said openable cover defines a zipper closure and flap covering said closure, said flap having means to fasten same to another portion of said cover, covering said closure.

2. A combined hydromassage apparatus and conventional body massager waterproof support vibrating cushion as set forth in claim 1 and including a pressure switch disposed just inside a portion of said cover, and said cover being marked externally of said switch to indicate where to press to actuate said switch.

* * * * *